United States Patent
Black et al.

(10) Patent No.: US 6,834,183 B2
(45) Date of Patent: Dec. 21, 2004

(54) VCO GAIN TRACKING FOR MODULATION GAIN SETTING CALIBRATION

(75) Inventors: Gregory Black, Vernon Hills, IL (US); Daniel B Schwartz, Gold Canyon, AZ (US); Kevin Traylor, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 64 days.

(21) Appl. No.: 10/287,382

(22) Filed: Nov. 4, 2002

(65) Prior Publication Data

US 2004/0087285 A1 May 6, 2004

(51) Int. Cl.[7] ............................................. H04B 11/18
(52) U.S. Cl. ............................... 455/182.1; 455/183.2; 455/182.3; 331/17
(58) Field of Search ................................. 455/126, 113, 455/118, 164.1, 255, 164.2, 165.1, 147, 262, 260, 264, 183.2, 185.1, 186.1, 192.1, 575.1, 550.1, 42, 44, 180.1–181.1, 182.2–184.1; 331/1 R, 17, 16, 44, 23, 175, 25, 177 R; 375/376, 373; 327/156, 159; 332/128

(56) References Cited

U.S. PATENT DOCUMENTS

| 5,834,987 A | * 11/1998 | Dent ........................... 332/127 |
| 5,952,895 A | 9/1999 | McCune, Jr. et al. ........ 332/455 |
| 5,983,077 A | * 11/1999 | Dent ............................ 455/44 |
| 6,441,690 B1 | * 8/2002 | Savelli et al. ................ 331/1 A |
| 6,549,078 B1 | * 4/2003 | Sridharan et al. ............. 331/17 |
| 2003/0231068 A1 | * 12/2003 | Humphreys ................... 331/17 |

* cited by examiner

Primary Examiner—Edward F. Urban
Assistant Examiner—C. Chow
(74) Attorney, Agent, or Firm—Posz & Bethards, PLC; Charles W. Bethards

(57) ABSTRACT

Voltage controlled oscillator (VCO) gain tracking is used for programming modulation gain settings to minimize modulation distortion in a phase locked loop of a mobile station (10). A synthesizer (20) generates a tuning voltage (Vt) for controlling a frequency of a (VCO) modulated radio frequency signal. A controller (22) outputs a modulation data signal and includes an ADC (72) for receiving the tuning voltage from the synthesizer (20) on a VCO feedback loop (70), a gain control lookup table (LUT) (76) for storing gain setting calibration data for respective mobile station sub-bands, and a gain setting (DAC) (78) for outputting a modulation gain control signal to the synthesizer (20). The modulation gain setting calibration data is calibrated using a one-time or continuous calibration methodlogy during, respectively, a background or normal mode of operation.

30 Claims, 6 Drawing Sheets

VCO GAIN TRACKING FOR MODULATION GAIN SETTING CALIBRATION

FIELD OF THE INVENTION

The present invention relates to wireless communications, and specifically to wireless communications where voltage controlled oscillator (VCO) gain tracking is used for setting modulation gain.

BACKGROUND OF THE INVENTION

Phase locked loops (PLLs) are used to drive local oscillators for upconverters (transmitters) and downconverters (receivers) in telecommunications equipment and systems. PLLs can also be equipped with modulators and/or demodulators for the associated transmitters and receivers of the type that respectively send and receive constant envelope signals such as signals having phase and/or frequency modulation, as well as with non-constant envelope transmitters and receivers in which a signal is expressed as a combination of multiple constant envelope signals (linc modulation) or as a constant envelope signal and a separate envelope-defining signal (polar modulation).

The accuracy of PLL based modulators and demodulators depends on whether the PLL bandwidth is sufficiently large compared to the bandwidth of the signals being transmitted and received. However, the PLL bandwidth may be limited by the need for low output radio frequency (RF) spectrum noise at offset frequencies near the edge of the modulation bandwidth. For many signal types, the signal bandwidth is typically near channel spacing, and low spectral noise is needed so that blocking effects from signals on adjacent channels can be minimized.

Dual port PLLs are commonly used for broadening the PLL response to a modulation or demodulation signal while at the same time maintaining low output RF spectrum noise. In, for example, a fractional-N modulating synthesizer, there are two signal paths between the data input, and the phase or frequency modulated output signals. Signal flow analysis requires that networks containing a single loop and having more than one forward path have a transfer function determined by the sum of the transfer functions of the forward paths divided by one plus the transfer function of the loop.

However, modulation accuracy is highly dependent on variations in Kv, the VCO gain. The degree of sensitivity to variation in Kv depends on the PLL bandwidth. For lower PLL bandwidths, the sensitivity of modulation accuracy to Kv variation may become higher than can be tolerated by system requirements.

For example, in a GMSK fractional-N modulator, the signal bandwidth is approximately 200 KHz, and there are strict spectral noise requirements at the 400 KHz offset frequency of −113 dBC/Hz. In commercially available PLL integrated circuits the noise stimulus from the phase detector output dominates the output RF spectrum. A typical in-band noise level is approximately −100 dBC/Hz. A 150 KHz PLL can be employed resulting in nominal 15 dB rejection to the phase detector noise stimulus at 400 KHz. This results in an output RF spectrum noise of −114 dBc/Hz, which marginally passes the requirement. However the PLL rejection is insufficient when PLL parameters vary in such a way as to widen the PLL bandwidth. Therefore, there is a need for lower PLL bandwidth in order to obtain additional margin in the output RF spectrum noise. Adjusting the loop filter transfer function can reduce the PLL bandwidth. For instance, in order to reduce the bandwidth by a factor of 0.5 and bring the PLL bandwidth down to 75 kHz, loop filter resistors can be reduced by a factor of 2 and the capacitors increased by a factor of 4.

However, if the PLL bandwidth is lowered as discussed above, modulation distortion becomes problematic due to variations in Kv. For example, in GSM system modulation, distortion is defined as global phase error, which is a spectrally weighted function of the rms phase error over the modulation bandwidth. Global phase error caused by PLL distortion is primarily a function of variation in Kv from the ideal value of the inverse of the high port gain. Conversely, the global phase error can be said to be a function of the variation in the high port gain from the ideal value of 1/Kv. Hardware stabilization or control of Kv is difficult, but the variable high port gain can be controlled quite easily by programming a multiplying DAC. For the two PLL bandwidth cases discussed above, in the 150 KHz case global phase error has been shown to be less than 5° for an approximate 2:1 variation of the gain setting. Therefore, with a fixed gain setting, the PLL is tolerant of an approximately 2:1 variation in Kv. However, in the 75 KHz case, the PLL has been shown to be approximately three times more sensitive to variations in Kv, whereas tolerances of Kv of less than 1.5:1 can be difficult and expensive to realize with available oscillators.

Therefore, what is needed is a method and system for optimally adjusting the high port gain of a dual port PLL in a synthesizer based on the value of Kv.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF THE PRESENTLY PREFERRED EXEMPLARY EMBODIMENTS

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in integrated circuits (ICs) including for example custom, commercially available, or application specific ICs and software programs or instructions. It is expected that one of ordinary skill, notwithstanding possibly significant effort and many design choices motivated by, for example, available time, current technology, and economic considerations, when guided by the concepts and principles disclosed herein will be readily capable of generating such ICs or software instructions and programs with minimal experimentation. Therefore, in the interest of brevity and minimization of any risk of obscuring the principles and concepts according to the present invention, further discussion of such software and ICs, if any, will be limited to the essentials with respect to the principles and concepts used by the preferred embodiments.

Figure 1:
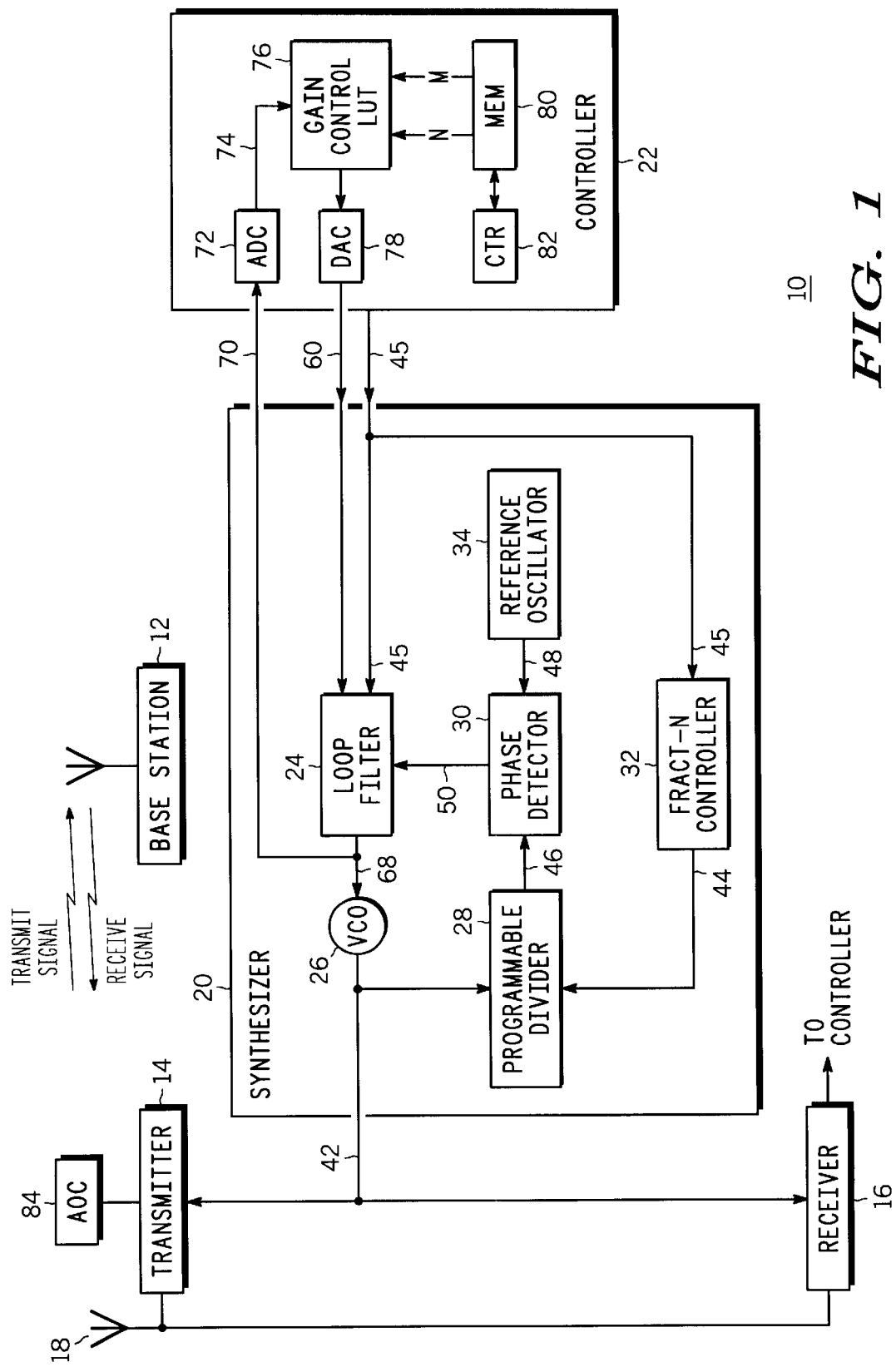
FIG. 1 is a block diagram of a mobile station in which fract-N modulation with VCO gain tracking is implemented.

Referring now to the drawings in which like numerals reference like parts, FIG. 1 shows a mobile station 10. The mobile station 10 may be any type of wireless phone, data or messaging device such as, for example, a code division multiple access (CDMA) or GSM type cellular telephone, that is capable of communicating with other like wireless devices or with public switched telephone network landline devices through a base station 12 using a conventional wireless protocol as is well known in the art. In addition to including a conventional transmitter 14 and receiver 16 for respectively transmitting and receiving wireless communications signals over an antenna 18, the mobile station 10 also includes a synthesizer 20 and a controller 22 that each include components that enable modulation of wireless communications signals with voltage controlled oscillator (VCO) gain tracking so that the modulation on the channels in the bands and sub-bands on which the mobile station 10 operates can be automatically calibrated in a manner that will be discussed below in more detail.

At this point it will be appreciated by those skilled in the art that various gain stages, filters and other components are customarily implemented between the transmitter 14 and the VCO 26. However, for purposes of describing the present invention and for ease of illustration, these components are not shown in FIG. 1.

The synthesizer 20 is preferably a dual port multi-accumulator fractional-N, or fract-N, synthesizer of the type well known to those skilled in the art. However, the synthesizer 20 may alternatively be any synthesizer, such as a delta-sigma synthesizer, that is capable of modulating a carrier signal to produce and output or provide a modulated radio frequency (RF) signal to the transmitter 14. The synthesizer 20 includes a loop filter 24, a voltage controlled oscillator (VCO) 26, a programmable divider 28, a phase detector 30, a fract-N controller 32 and a reference oscillator 34 that are intercoupled as depicted and together form a conventional phase-locked loop (PLL).

As is well known, the VCO 26 generates a carrier signal at a frequency and with modulation that a tuning voltage Vt generated by the loop filter 24 controls, thereby producing an RF signal at 42. In addition to being output to the transmitter 14, the RF signal is also input into the programmable divider 28, which divides the RF signal by a predetermined value Ndiv, with Ndiv being a value that is determined by the fract-N controller 32 and output to the programmable divider 28 at 44. The value Ndiv, which is based on a modulation data signal input from the controller 22 over a data signal line 45, controls the modulation of the carrier signal generated by the VCO 26. It does so by causing the programmable fract-N controller 32 to generate and output at 44 a fractional-n waveform to control the divider 28 to produce a frequency divided RF signal that is output at 46 to the phase detector 30. The value Ndiv output over the data signal line 45 also controls the modulation of the carrier signal generated by the VCO 26 by driving a high port input, also referred to as the reference numeral 45, of the loop filter 24.

The phase detector 30 generates an error signal representing the difference in phase between the divided RF signal output from the phase detector at 46 and a reference signal generated by and output at 48 from the reference oscillator 34, which is preferably a quartz crystal based oscillator that generates a reference oscillator signal having a frequency of about 26 MHz. The phase detector 30 then inputs the error signal into the loop filter 24 through a low port 50 of the loop filter 24 or, more generally, through a low port of the synthesizer 20.

Figure 2:
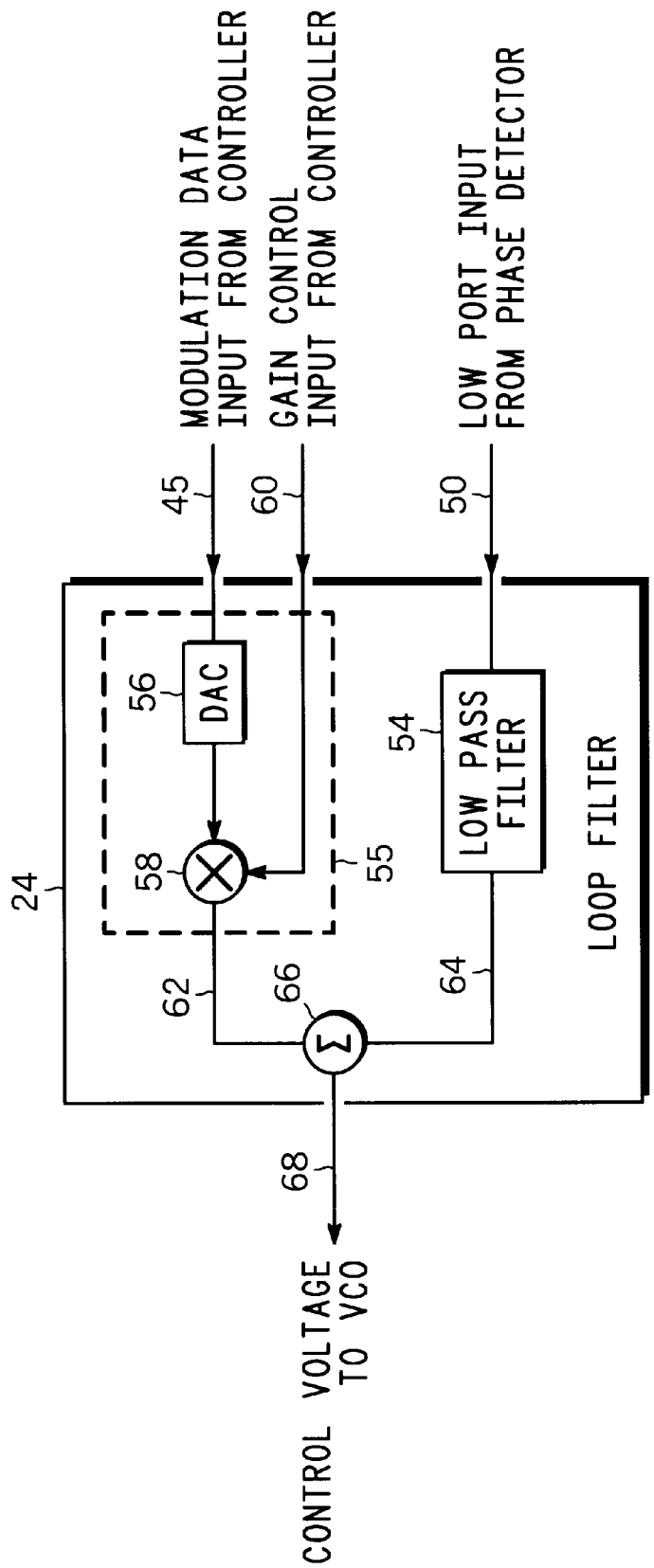
FIG. 2 is a block diagram of a loop filter utilized in implementing fract-N modulation with VCO gain tracking in the mobile station in FIG. 1.

Referring now to FIG. 2, components of the loop filter 24 will now be discussed. The loop filter 24 includes a lowpass filter 54 for filtering the error signal input from the phase detector 30. The loop filter 24 also includes a multiplier digital to analog controller (DAC) 55 that, via a digital to analog converter (DAC) 56, converts the modulation data signal input through the synthesizer high port 45 to an analog signal. The DAC 56, which is preferably a 10-bit DAC, and a multiplier 58, or amplifier with a controllable gain, that multiplies the modulation data signal input through the synthesizer high port 45 by an analog reference voltage, or high port gain control signal. The high port gain signal is, in the case of a 10-bit DAC, a 6-bit signal generated by the controller 22, converted to an analog signal by, and output through, a gain setting DAC 78 in the controller 22 and input through a gain control port 60 of the loop filter 24. Therefore, the DAC 55 has a gain that is controlled by the high port gain control signal input through the gain control port 60.

The resulting analog signal output at 62 from the multiplier DAC 55 is an output voltage that represents a high port signal to be modulated on the carrier signal generated by the VCO 26. The high port signal 62 is then summed by a summer 66 with the filtered error signal output at 64 from the lowpass filter 54 to produce a tuning voltage Vt. The tuning voltage, or tuning voltage, Vt is output to the VCO 26 at a loop filter output 68 to control the modulation frequency of and, more specifically, to modulate the RF signal that is provided or output at 42 in FIG. 1 by the VCO 26. As shown in FIG. 1, in addition to being output to the VCO 26, the tuning voltage Vt is also fed back to the controller 22 via a VCO gain tracking feedback loop 70 to enable VCO gain tracking to be performed to enable modulation gain setting calibration data or, more generally, calibration data, stored in the LUT 76 to be updated. The more general term calibration data may be used to describe the data stored in the LUT 76 to emphasize the fact that the data may either be the actual modulation gain setting calibration data for setting the gain of the high port gain control signal output at 60 by the controller 22, or alternatively more unrefined data, such as the value of the tuning voltage Vt, the controller 22 may use to calculate the modulation gain setting calibration data.

Referring back to FIG. 1, the controller 22 includes an all-purpose ADC 72 that, during gain setting calibration, alternatively referred to as gain setting updating, receives the tuning voltage Vt from the VCO gain tracking feedback loop 70, converts the tuning voltage Vt to a digital gain control signal, and outputs the digital gain control signal at 74 to a gain control lookup table (LUT) 76. The gain control LUT 76 is an appropriately sized memory for storing calibration data to be used depending on the channel setting of the synthesizer 20. The requisite modulation accuracy and the channel grouping strategy determine the number of different channel settings. For instance, one possible strategy is to have an equal number of contiguous channel groupings, hereinafter referred to as sub-bands, for each band of operation. Another strategy might employ channel groupings of various sizes, with the smaller channel groupings for channel frequencies corresponding to frequency regions having a larger variation in VCO gain.

During subsequent operation of the mobile station 10, the gain control LUT 76 outputs the appropriate calibration to a gain setting DAC 78 based on the band index (n=0 to N−1, where N is a positive integer greater than 1) and sub-band index (m=0 to M−1, where M is a positive integer greater than 1) data stored in a controller memory 80 and identified by the controller 22 as corresponding to the channel on which the mobile station 10 is operating. Methods for determining the gain settings stored in LUT 76 will now be discussed.

A loop transfer function H(s) is needed to determine phase modulation accuracy:

$$H(s) = \frac{\text{Phase\_out}}{Vin} \quad (1)$$

$$= \frac{[Hhp(s)*Kv] + [(Icp*Zlf(s)*Kv)/(s*Nd)]}{1 + [(Icp*Zlf(s)*Kv)/(s*Nd)]}$$

$$= \frac{[Hhp(s)*Kv]}{1 + [(Icp*Zlf(s)*Kv)/(s*Nd)]} + Hcl(s)$$

Note that s is the LaPlace variable, −j*2*pi*freq, Hhp(s) is the high port gain setting, Icp is the loop phase detector gain, Zlf(s) is the loop filter low port transfer impedance, Kv is the VCO gain, Nd is the average divisor of the programmable frequency divider, while Hcl(s) is the closed loop gain ignoring the high port path. The importance of Hcl(s) is that it determines the PLL's suppression of the noise stimuli that dominate the output RF spectral noise. These stimuli include the noise floor at the phase detector 30 and the fractional-N waveform noise.

For minimum distortion of the modulated signal, H(s) must be equal to one. This means that Hhp(s), the transfer function between the multiplying DAC 55 and the VCO 26, needs to equal 1/Kv, where Kv is the VCO gain, as shown below in equation (2).

$$Hhp(s) = 1/Kv \quad (2)$$

When Hhp(s) has the above value, modulation distortion in a dual port system is relatively unaffected by variations in parameters such as the gain of the phase detector 30, the divider ratio N, and the components of the loop filter 24 that determine the loop filter transfer impedance, Zlf(s). This insensitivity to parameter variation (except for variation in Kv) is why a dual port synthesizer, or, more specifically, a dual port PLL, is a better solution than other approaches to the problem of modulation accuracy for applications such as digital predistortion. From Equation (2) above, the optimum gain setting is the reciprocal of the VCO gain Kv. An interim determination of the VCO gain Kv may be made during the process of determining the calibration data. The VCO gain Kv is the first derivative of the VCO output frequency with respect to the VCO tuning voltage Vt, which can be expressed as the limit of the change in VCO output frequency divided by the change in Vt as the change in Vt approaches zero. This can be approximated as the difference in VCO output frequency, ΔF, divided by the difference in VCO tuning voltage, ΔVt:

$$Kv \sim = (\Delta F/\Delta Vt) \quad (3)$$

For a contiguous grouping of channels, the VCO gain Kv can therefore be approximated as the frequency separation of two channels divided by the difference in VCO tuning voltage for the two channels.

A modulation or, more specifically, high port, gain setting calibration process will now be described for the channel grouping strategy of having an equal number M−1 sub-bands for each band. For each sub-band, defined by band index n and sub-band index m, a high port gain setting is calibrated as follows. The synthesizer 20 is sequentially programmed by the controller 22 to the lowest channel in the sub-band having band index n and sub-band index m, followed by the lowest channel having band index n and sub-band index m+1. The controller 22 uses the ADC 72 to convert the tuning voltage Vt, measured for each of the two channels during operation of one of the calibration methodologies that will be described below to first and second digital tuning voltage measurements, and the tuning voltage difference, ΔVt, is calculated. The high port gain setting Ahp is calculated by letting Ahp=Hhp(s), using Equation (2), and substituting Kv from Equation (3) to yield $$Ahp = C1*(\Delta Vt) \quad (4)$$

where C1 is a proportionality constant stored in the controller memory 80 to account for the value of the frequency difference between sub-bands as well as other constant factors that affect the high port gain calculation, such as the gain factors of the VCO gain tracking feedback loop 70 and the ADC 72, as will be understood by those skilled in the art. The process of controlling the synthesizer 20 to two channel settings, feeding back the tuning voltage Vt for each, calculating the high port gain setting and storing the high port gain setting in the LUT 76 is repeated for all band and sub-band settings. Since the initial calibration may be executed without having valid gain control signals in the LUT 76, the modulation accuracy may be poorer or less than can be tolerated by system requirements. For this reason, the initial calibration may be best suited for a background mode of operation in which the output signal from the transmitter 14 is attenuated by disabling the automatic output controller (AOC) 84, as will now be described.

Figure 3:
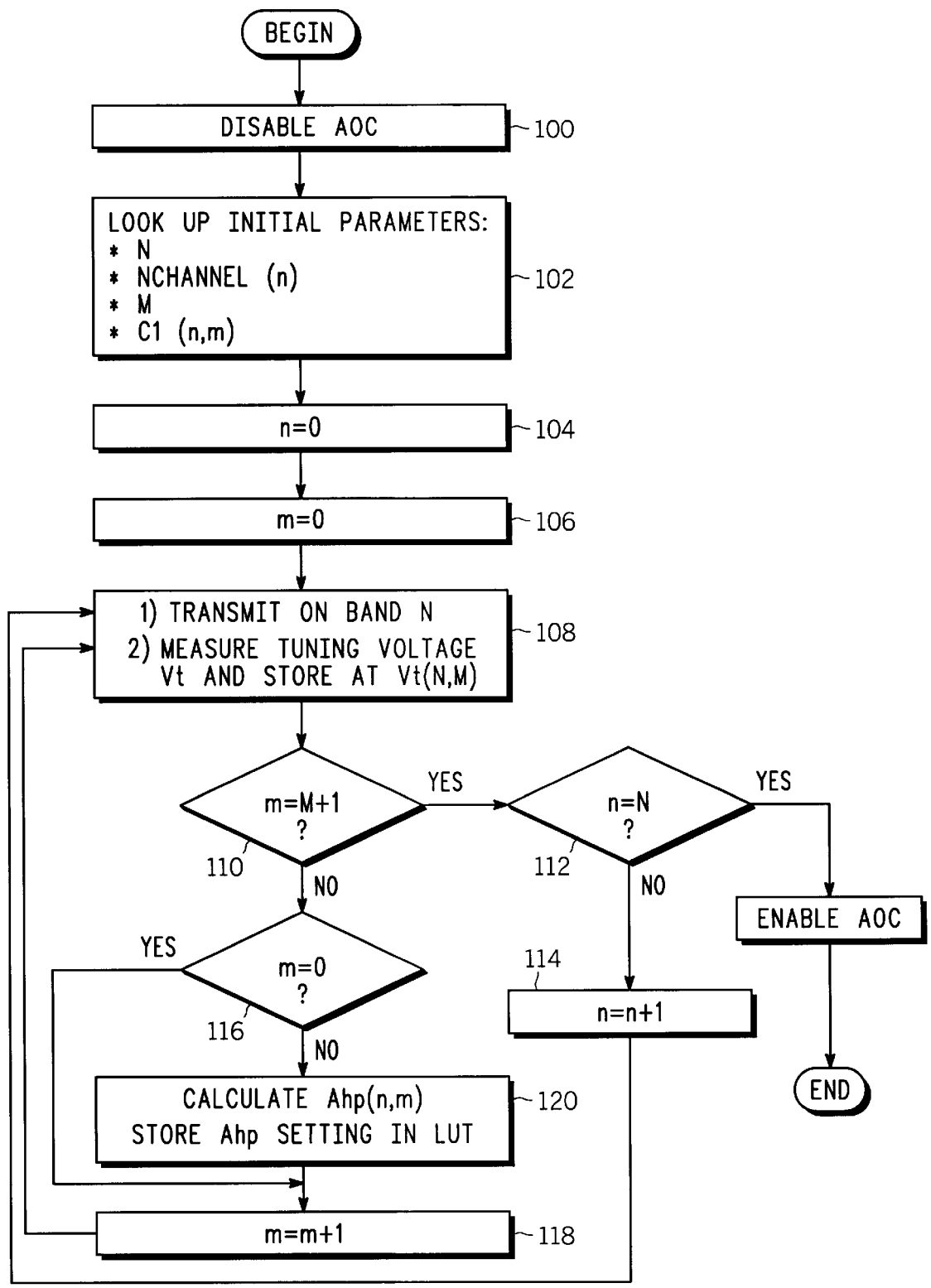
FIG. 3 is a flow diagram of a one-time automatic channel calibration routine utilized to calibrate the mobile station in FIG. 1 using fract-N modulation with VCO gain tracking.

Referring to FIGS. 1 and 3, initially at 100, the AOC 84 is disabled by the controller 22 to assure that amplifiers and switches (not shown) in the transmitter 14 are in a maximum state of attenuation and that a power level at the antenna 18 is below a spurious emissions limit. At 102, the controller 22 looks up initial parameters from controller memory 80, including the number of bands N, the number of channels per band Nchannel(n), the number of sub-bands per band M and proportionality constants C1(n,m).

Regarding the above parameters, there are typically 3 bands for mobile stations programmed to communicate via, for example, GSM, DCS or PCS wireless protocol, with each channel band typically being divided into 5 sub-bands. For example, the DCS1800 operating band covers 75 MHz with 375 channels; therefore, the band may be divided into 15 sub-bands of 5 MHz each with each containing 25 channels. Therefore, the LUT 76 may be programmed to store a gain setting for each of these sub-bands or, alternatively, for just the bands, depending upon the level of accuracy required at the VCO 26. The number of bands and sub-bands may vary depending upon the type of communications protocol and the accuracy required. In the most demanding case, the number of channels per sub-band is one and the LUT 76 contains a gain control setting for every channel.

At 104 and 106, a counter 82 in communication with the memory 80 is reset so that band index n=0, and sub-band index m=0. At 108, the controller 22 programs the synthesizer 20 to transmit pseudorandom data on sub-band m of band n. The controller 22 then measures the resulting tuning voltage Vt output from the loop filter 24 and stores the value of Vt as Vt(n,m) in the controller memory 80. At 110, the controller 22 determines if m=M+1. If so, gain settings have been determined for all sub-bands within the present band, and the controller 22 then determines at 112 if n=N. If so, gain settings have been determined for all bands, and the calibration methodology ends. If not, the counter 82 increments n to n+1 at 114 and subsequently returns to 108 to calibrate the sub-bands in the next band.

If at 110 the controller 22 determines that m≠M+1, at 116 it next determines if m=0. If so, Vt has not been measured for two points. The counter 82 therefore increments m to m+1 at 118. Subsequently, the controller 22 returns to 108 to transmit pseudorandom data on a second channel within the sub-band presently being calibrated, and to measure the associated Vt. If not, Vt has been measured for two points within the sub-band, and at 120 the controller 22 calculates the value of the high port gain setting Ahp according to Equation (4) above. Once the controller 22 has calculated the high port gain setting Ahp for the particular sub-band, it stores the value in the LUT 76. At 118, the counter 82 then increments m to m+1, and the controller 22 returns to 108 to calibrate the next sub-band.

It is contemplated that the above calibration methodology may be initiated during factory programming of the mobile station 10, or alternatively at, for example, power-up prior to use. However, in cases where the bandwidth of the phase locked loop of the synthesizer 20 is small relative to the bandwidth of the modulated signal, a one-time factory calibration may not be sufficient due to parametric shifts due to, for example, component aging, and a start-up calibration may not be sufficient due to parametric variation with temperature. In such cases, phase locked loop distortion due to variations in the initial parameters may need to be addressed by recalibrating the high port gain values in the LUT 76 during normal operation of the mobile station 10. Such a continuous calibration methodology is based on tuning voltage measurements that are made during normal operation without the need for special tuning waveforms and without affecting the modulated RF signal generated by the VCO 26 and transmitted by the transmitter 14.

Figure 4:
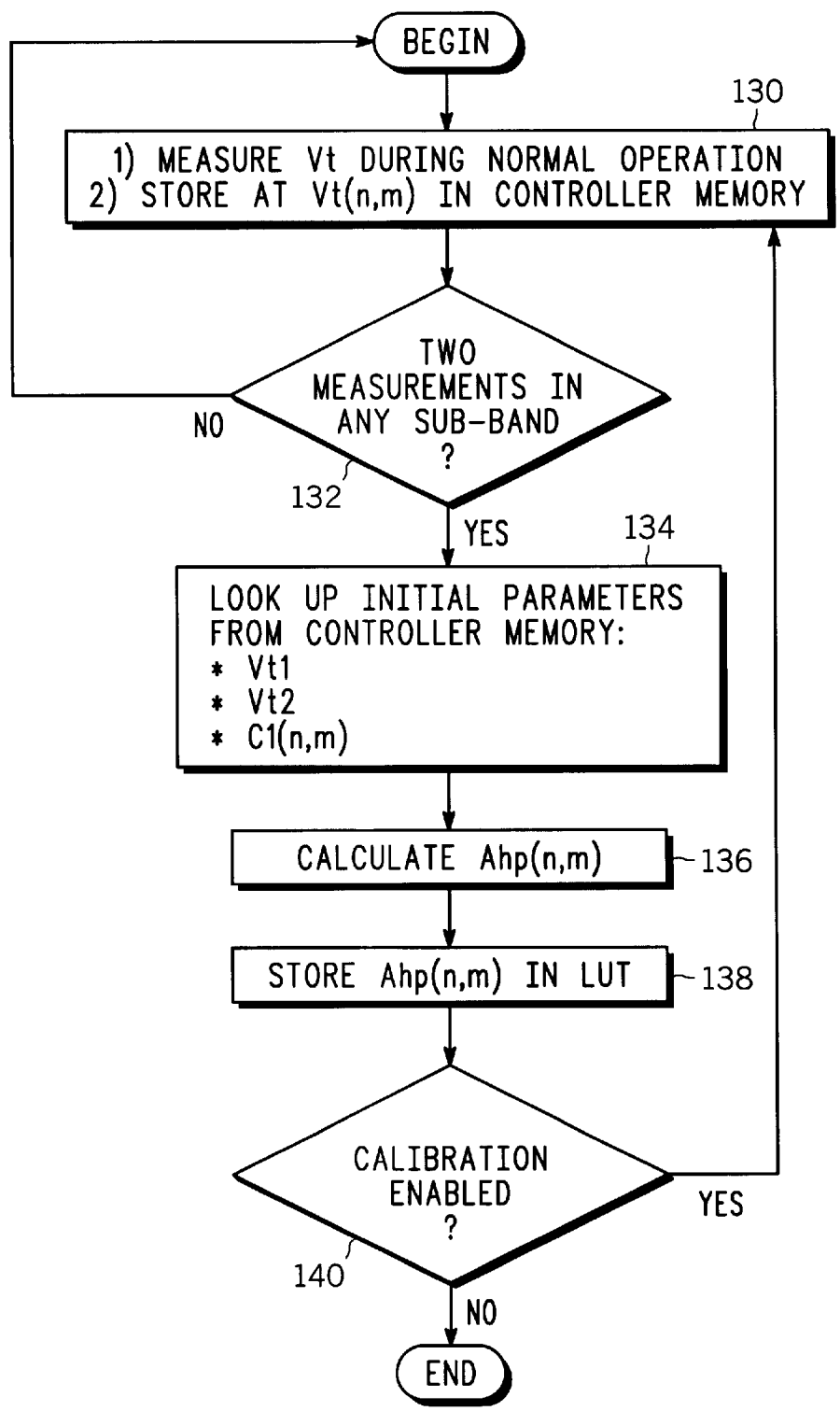
FIG. 4 is a flow diagram of a continuous automatic channel calibration routine utilized to calibrate the mobile station in FIG. 1 using the fract-N modulation with VCO gain tracking.

FIG. 4 illustrates the methodology for implementing the above continuous calibration. This calibration is performed while the synthesizer 20 is programmed according to the RF channel requirements for normal transceiver operation. At 130, the controller 22 measures the VCO tuning voltage Vt fed back from the VCO gain tracking feedback loop 70 and stores the measured value of Vt in the controller memory 80.

At 132, the controller 22 determines whether two tuning voltages Vt1, Vt2 at different channels, or points, in a sub-band have been stored. If two tuning voltages Vt1, Vt2 have been stored, at 134, the controller 22 then looks up initial parameters as at 102 in FIG. 3, including the values of Vt1, Vt2 and the proportionality constant C1(n,m), and then at 136 calculates the high port gain setting Ahp as at 120 in FIG. 3. At 138, the controller 22 stores the value of the high port gain setting Ahp in the LUT 76, and the methodology then checks to see if the continuous calibration methodology is still enabled at 140. If it is enabled, the methodology returns to 132, and if it is not enabled it ends.

The described calibration methodologies provide high port gain settings based on Equation (4) above where the VCO tuning voltages, Vt, are approximated by piecewise linear functions versus VCO output frequency or channel, where piecewise linear segments are defined over the frequency sub-bands, and where the slopes of the segments approximate the VCO gain Kv according to Equation (3) above. These methodologies have the advantage of simplifying the processing of the controller 22.

However, more complex methodologies may be employed for various reasons. One such reason is to reduce the number of tuning voltage measurements required. Another reason is to make the high port gain setting calculation less prone to error caused by tuning voltage measurement variability due to, for instance, differential non-linearity and quantization error in the ADC 72. One such more complex methodology, referred to hereinafter as curve fitting methodology, or more generally as curve fitting, will now be discussed.

Curve fitting requires a model equation of actual system behavior in terms of an independent variable versus a dependant variable. The curve fitting of interim dependant variable Vt versus VCO frequency or channel will now be discussed, employing the transform to Ahp from ΔVt by Equation (3). However, curve fitting of other interim variables such as Kv, or, more directly, curve fitting of Ahp versus frequency or channel, is also possible.

VCO circuit designs vary in their Vt versus frequency behavior, but generally are well-behaved in the sense that a low order polynomial provides an accurate model. Closed form expressions for curve fitting to a polynomial model can be derived by employing the mathematical concept of determinants in the form of algebraic functions of pairs of Vt and frequency or channel data points. The number of data pairs needed to generate a polynomial model is equal to the order of the polynomial plus one. Hence, the number of tuning voltage measurements required, Nmin, is the order of the polynomial plus 1. An exemplary second order polynomial model of Vt versus frequency is shown below, with it being understood by those skilled in the art that higher order polynomials may be used depending upon VCO circuit behavior:

$$A*f + B*Vt^2 + C*Vt + D = 0 \tag{5}$$

Using three pairs of Vt and f measurements, the coefficients A, B, C and D of Equation (5) can be determined, as represented below in matrix form:

$$\begin{bmatrix} f & Vt^2 & Vt & 1 \\ f_1 & Vt_1^2 & Vt_1 & 1 \\ f_2 & Vt_2^2 & Vt_2 & 1 \\ f_3 & Vt_3^2 & Vt_3 & 1 \end{bmatrix} * \begin{bmatrix} A \\ B \\ C \\ D \end{bmatrix} = 0$$

Then, matrix determinants can be used to provide the coefficients of the polynomial model:

$$A = \begin{vmatrix} Vt_1^2 & Vt_1 & 1 \\ Vt_2^2 & Vt_2 & 1 \\ Vt_3^2 & Vt_3 & 1 \end{vmatrix}$$

$$B = -\begin{vmatrix} f_1 & Vt_1 & 1 \\ f_2 & Vt_2 & 1 \\ f_3 & Vt_3 & 1 \end{vmatrix}$$

$$C = \begin{vmatrix} f_1 & Vt_1^2 & 1 \\ f_2 & Vt_2^2 & 1 \\ f_3 & Vt_3^2 & 1 \end{vmatrix} \text{ and}$$

$$D = -\begin{vmatrix} f_1 & Vt_1^2 & Vt_1 \\ f_2 & Vt_2^2 & Vt_2 \\ f_3 & Vt_3^2 & Vt_3 \end{vmatrix}$$

The aforementioned methods of determining the model formula employ the minimum number of measurements, and these measurements exactly fit the resulting formula. For reasons discussed below, it may be useful to utilize more than the minimum number of measurements.

When there is noise in the measurement due to, for instance, quantization and differential nonlinearity in the ADC 72, it is preferable to use more than the minimum number of measurements to estimate the model formula. This may be accomplished by calculating the lower order coefficients of a higher order polynomial according to the aforementioned curve fitting methodology, and setting the higher order coefficients to zero. Curve estimation methodology, to be discussed next, may be useful in cases where greater accuracy of the Ahp setting is required. Curve estimation may also be used for non-polynomial model formulae in which the closed form expression of the model coefficients is not practical or possible. Curve estimation techniques require a minimum number of measurements, Nmin, to bring to an acceptable level the error on the channel gain setting Ahp caused by measurement noise.

For curve estimation, the model formula cannot exactly fit all of the data points but tends to exclude the effects of measurement noise. It is not generally practical or possible to employ closed form expressions for the best estimate of the model formula. Methods commonly referred to as regression techniques employ iterative approaches for finding the model formula that provides the minimum error function. One such error function, for example, is a least squares error function, which is the sum of the squares of the difference between the measured data and the data produced by the model formula.

After having determined the model formula, a methodology for calculating and storing high port gain control settings Ahp into the LUT 76 can be utilized. For example, if the channel grouping strategy of having an equal number of contiguous channel groupings for each band of operation is chosen, the resulting methodology is as shown in FIG. 5.

Figure 5:
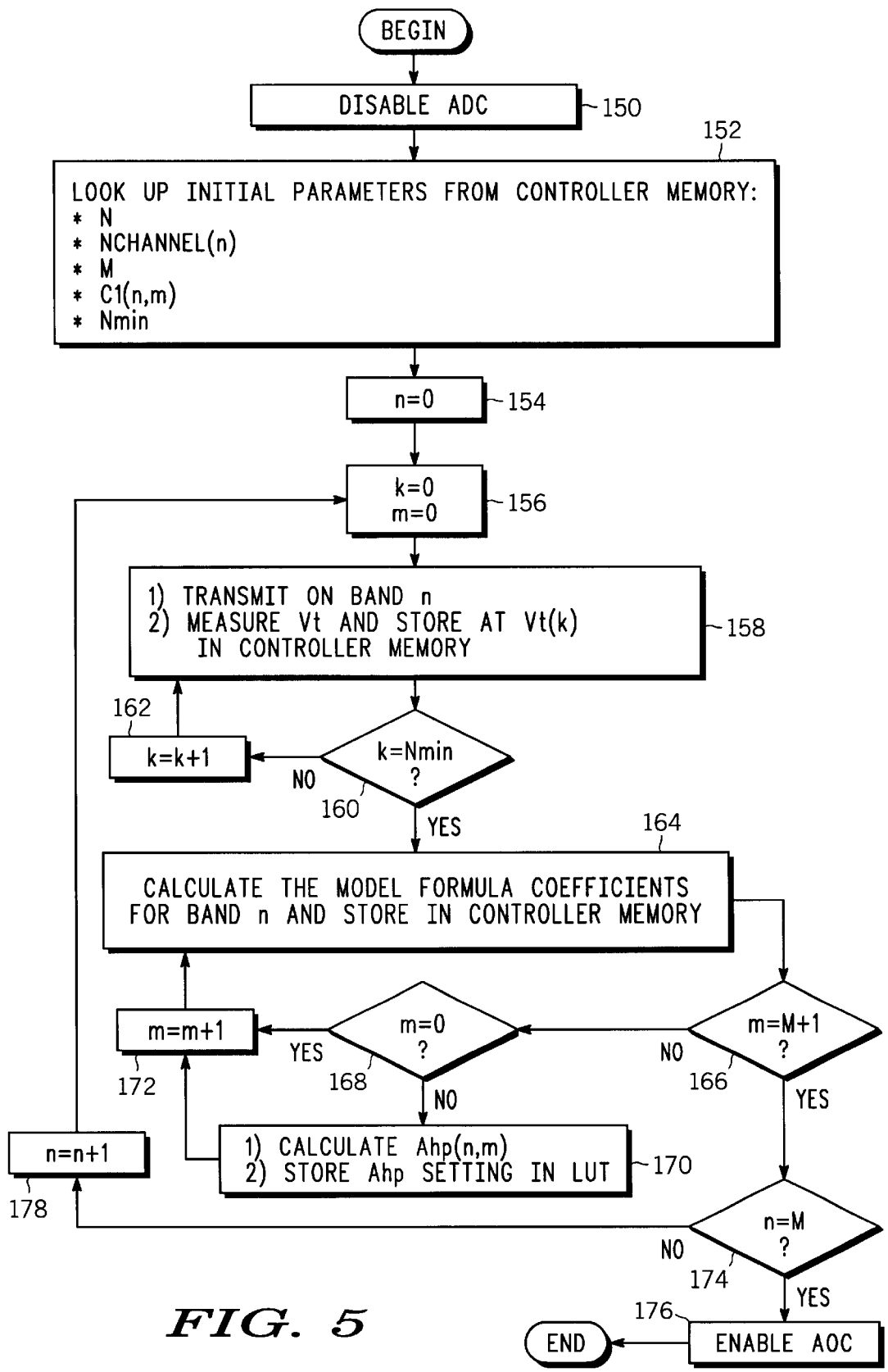
FIG. 5 is a flow diagram of a one-time automatic channel calibration routine utilized to calibrate the mobile station in FIG. 1 using fract-N modulation with VCO gain tracking.

Specifically, referring to FIGS. 1 and 5, initially at 150 the AOC 84 is disabled by the controller 22, and at 152 the controller 22 looks up initial parameters from the controller memory 80, including the number of bands N, the number of channels per band Nchannel(n), the number of sub-bands per band M, proportionality constants C1(n,m) and, in addition, a minimum number of measurements, Nmin, required to bring to an acceptable level the error on the channel gain setting Ahp caused by measurement noise.

At 154 and 156, the counter 82 is reset so that band index n=0, k (a measurement counter index)=0 and sub-band index m=0. At 158, the controller 22 programs the synthesizer 20 to transmit pseudorandom data on sub-band m of band n. The controller 22 then measures the resulting tuning voltage Vt output from the loop filter 24 and stores the value of Vt(k) in the memory 80. At 160, the controller 22 determines if k=Nmin. If not, at 162 the counter index k is incremented to k+1 and the methodology returns to 158 to transmit pseudorandom data and to subsequently measure Vt and store Vt(k) in the memory 80. If so, the minimum number of required measurements has been reached, and at 164 the controller 22 calculates the model formula coefficients for the band n, using, for example, Equation (5) above for the case of a second order polynomial model, and stores them in the memory 80.

Subsequently, at 166, the controller 22 determines if m=M+1. If not, and the controller 22 at 168 determines that m≠0, at 170 the controller 22 calculates the high port gain setting Ahp(n,m) for the present sub-channel and stores it in the LUT 76. Subsequently, the counter 82 increments the count m to m+1 at 172 and the methodology returns to 164 where model coefficients are then calculated for the next sub-band m+1 in band n. If, on the other hand, the controller 22 determines at 168 that m=0, the methodology proceeds directly to 172.

If at 166 the controller 22 determines that m=M+1, at 174 the controller 22 determines if n=N. If so, Ahp(n,m) settings have been calculated for all bands and sub-bands, at 176 the AOC 84 is enabled, and the methodology ends. If not, at 178, n is incremented to n+1 and the methodology returns to 156, where k and m are reset to zero prior to calibration of sub-bands on the next band.

Figure 6:
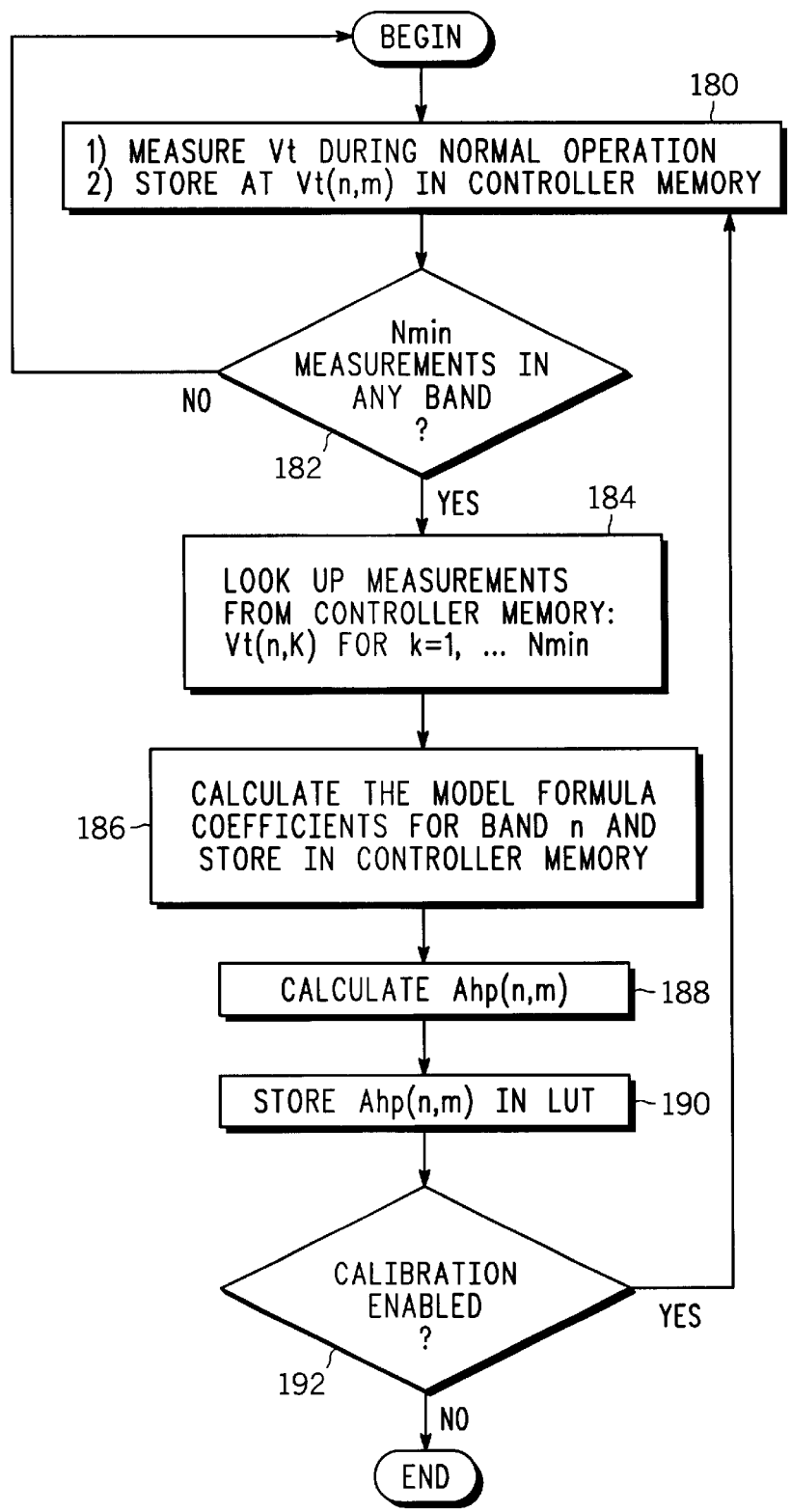
FIG. 6 is a flow diagram of a continuous automatic channel calibration routine utilized to calibrate the mobile station in FIG. 1 using fract-N modulation with VCO gain tracking.

Referring next to FIGS. 1 and 6, a method of continuously updating the high port gain settings in the LUT 76 using the above discussed curve fitting or curve estimation techniques will now be discussed. During normal operation of the mobile station 10, at 180 the controller 22 measures the tuning voltage Vt fed back from the VCO gain tracking feedback loop 70 and stores Vt in the memory 80 according to the band of operation. At 182, the controller 22 determines whether Vt has been measured a minimum number of times Nmin in the band n and stored. If Vt has been measured Nmin times and stored, at 184, the controller 22 then looks up initial parameters Vt(n,k) for k=1 to Nmin for band n, and then at 186 calculates model formula for band n, using, for example, Equation (5) above for the case of a second order polynomial model, and stores the results in the memory 80.

Subsequently, at 188, the controller 22 calculates Ahp(n, m) for the sub-band m in use in band n based on the stored model coefficients and at 190 stores the calculated gain setting Ahp(n,m) in the LUT 76. At 192, the methodology then determines if the continuous calibration methodology is enabled and, if so, returns to 180. If it is not enabled, the methodology ends.

It should be noted at this point that the foregoing discussion is directed toward operation of the mobile station 10 with respect to the transmitter 14. However, it should be appreciated by those skilled in the art that the automatic high port, or modulation, gain setting calibration according to the present invention may also be deployed with respect to modulated signals received by the receiver 16 and subsequently output to and processed by the controller 22. The mobile station configuration could be one such as that shown at 10 in FIG. 1, or it may be one where a separate synthesizer is deployed for the receiver, such as in a full duplex radio.

While it is contemplated that the calibration routines of the present invention are applicable to any wireless protocol, it is specifically applicable to wireless protocols having wider signal bandwidths such as EGPRS, CDMA, wideband CDMA (WCDMA) and universal mobile telecommunications service (UMTS) based on the tradeoff in PLL bandwidth due to the aforementioned output RF spectrum and modulation distortion.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A system for calibrating mobile station modulation gain settings, comprising:
    a synthesizer including a phase locked loop (PLL), the PLL for outputting a tuning voltage for controlling a frequency of a voltage controlled oscillator (VCO) modulated signal; and
    a controller in communication with the PLL for outputting a modulation data signal and including:
    an analog to digital converter (ADC) for receiving the tuning voltage fed back from the PLL on a VCO gain tracking feedback loop;
    a gain control lookup table for storing calibration data, determined based on the tuning voltage fed back from the PLL on the VCO gain tracking feedback loop, one or more respective mobile station sub-bands; and
    a gain setting DAC for outputting a modulation gain control signal to the synthesizer, the modulation gain control signal being derived from the calibration data retrieved from the lookup table based on a mobile station sub-band of operation, the modulation gain control signal depending on a curve estimating methodology to mitigate noise associated with the calibration data.

2. The system of claim 1, wherein the synthesizer comprises a multi-accumulator fract-N synthesizer.

3. The system of claim 1, wherein:
    the calibration data and the modulation gain control signal respectively comprise modulation gain setting calibration data and a high port gain control signal; and
    the PLL comprises:
    a loop filter with a high port DAC for converting the high port gain control signal and the modulation data signal input from the controller to produce a full-scale output voltage that represents a gain-controlled signal to be modulated;
    a phase detector for generating an error signal based on the tuning voltage; and
    a lowpass filter for filtering the error signal generated by the phase detector and a summer for summing the error signal and the signal to be modulated to produce the tuning voltage.

4. The system of claim 1, wherein the controller is programmed to perform a one-time update of the calibration data stored in the lookup table for the one or more respective mobile station sub-bands during a background mode of operation based on multiple tuning voltages measured on respective channels in contiguous sub-bands.

5. The system of claim 1, wherein the controller is programmed to perform continuous updating of the calibration data stored in the lookup table based on multiple measured tuning voltages, each of which is input thereto from the VCO gain tracking feedback loop, at multiple different locations in a sub-band in use during normal mobile station operation.

6. The system of claim 1, wherein the controller programs the calibration data stored in the lookup table for the one or more respective mobile station sub-bands by using curve estimation for the one or more respective mobile station sub-bands, the curve estimation reducing an effect of noise at an output of the ADC and using one of a polynomial curve fitting and a least squares error function.

7. The system of claim 1, wherein the controller programs the calibration data stored in the lookup table for the one or more respective mobile station sub-bands by using curve estimation for a number of measured tuning voltages, each input from the VCO gain tracking feedback loop, the number of measured tuning voltages being greater than a one plus an order of the curve estimation methodology.

8. The system of claim 1, wherein the gain control lookup table is further for storing the calibration data for the one or more respective mobile station sub-bands within each mobile station band.

9. A mobile station controller for controlling a dual port synthesizer, comprising:
    an analog to digital controller (ADC) for receiving a tuning voltage fed back on a voltage controlled oscillator (VCO) gain tracking feedback loop and for converting the tuning voltage to a digital signal;
    a lookup table for storing high port gain calibration settings for one or more respective mobile station sub-bands, the high port gain calibration setting being based on the tuning voltage fed back on the VCO gain tracking feedback loop; and
    a high port gain setting DAC for outputting a high port gain control signal based on the high port gain calibration settings stored in the lookup table in response to a mobile station sub-band of operation, the high port gain control signal further based on a curve estimating methodolgy to mitigate noise associated with the high port gain calibration settings.

10. The mobile station controller of claim 9, wherein the lookup table is updated during a one-time programming of the high port gain calibration settings for the one or more respective mobile station sub-bands stored therein during a background mode of operation and based on multiple tuning voltages measured on respective channels in contiguous ones of the one or more respective mobile station sub-bands.

11. The mobile station controller of claim 9, wherein the lookup table is updated whenever at least two tuning voltages, each of which is input thereto from the VCO gain tracking feedback loop, are measured at different locations in the mobile station sub-band of operation.

12. The mobile station controller of claim 9, wherein the lookup table is for storing the high port gain calibration settings during a mobile station background mode of operation.

13. The mobile station controller of claim 9, wherein the controller is programmed to update the high port gain calibration settings for the one or more respective mobile station sub-bands by using curve estimation for a number of measured tuning voltages, each of which is input thereto from the VCO gain tracking feedback loop, that is greater than one plus an order of the curve estimating methodology during a mobile station background mode of operation for the one or more respective mobile station sub-bands, the curve estimation using polynomial curve fitting to reduce an effect of noise at an output of the ADC.

14. The mobile station controller claim 9, wherein the controller is programmed to update the high port gain calibration settings for the one or more respective mobile station sub-bands by using curve estimation for a number of measured tuning voltages, each of which is input thereto from the VCO gain tracking feedback loop, that is greater than one plus an order of the curve estimation methodology during a mobile station background mode of operation for the one or more respective mobile station sub-bands, the curve estimation using a least squares estimate between a curve estimation model and the calibration data to reduce an effect of noise at an output of the ADC.

15. A method of calibrating modulation gain settings of a mobile station, comprising:
    looking up stored calibration parameters, including at least one of a number of sub-bands and number of channel measurements required for calibration of one or more of the number of sub-bands;
    transmitting on the one or more of the number of sub-bands;
    measuring fed-back tuning voltages resulting from the transmitting on the one or more of the number of sub-bands; and
    storing calibration data calculated based on the measuring of fed-back tuning voltages resulting from the transmitting on the one or more of the number of sub-bands for later use in determining respective modulation gain settings for the one or more of the number of sub-bands, the modulation gain settings further based on a curve estimating methodology to mitigate noise associated with the measuring of the fed-back tuning voltages.

16. The method of claim 15, further comprising disabling an amplified output control of a mobile station transmitter prior to the transmitting on a particular sub-band to enable a mobile station background mode of operation.

17. The method of claim 15, wherein the looking up of stored calibration parameters, including at least one of a number of sub-bands and number of channel measurements required for calibration of one or more of the number of sub-bands, includes looking up a number of contiguous sub-bands per band, and a number of tuning voltage measurements required for calibration of the one or more of the number of sub-bands;
    transmitting on channels in each of the number of contiguous sub-bands;
    measuring multiple tuning voltages during the transmitting on each of the number of contiguous sub-bands; and
    storing the calibration data calculated based on the measuring of multiple tuning voltages during the transmitting on each of the number of sub-bands.

18. The method of claim 15, further comprising calculating the calibration data for the one or more of the number of sub-bands by using curve estimation where a number of the fed-back tuning voltages exceeds two plus an order of a curve fitting polynomial and operates to reduce an effect of noise at an output of the ADC.

19. The method of claim 15, further comprising calculating the calibration data for the one or more of the number of sub-bands by using curve estimation when a number of the fed-back tuning voltages exceeds an order of the curve estimation by more than one, the curve estimation using a least squares estimate between a sum of squares of a difference between data produced by a curve estimation model and the calibration data to reduce an effect of noise at an output of the ADC.

20. A method of continuously updating high port gain calibration settings of a mobile station dual port input synthesizer, comprising:
    initiating a background mode of transmitter operation;
    measuring respective tuning voltages resulting from the initiating of a background mode of operation during transmitter operation at different locations in a mobile station sub-band of operation, each of which is input from a voltage controlled oscillator (VCO) gain tracking feedback loop;
    determining a high port gain calibration setting for the mobile station sub-band of operation based on a calculated polynomial model of tuning voltage versus frequency for the mobile station sub-band of operation, the calculated polynomial model based on a curve estimating methodology to mitigate noise associated with the measuring respective tuning voltages; and
    storing the high port gain calibration setting for setting high port gain for the mobile station sub-band of operation.

21. A mobile station transmitter configuration, comprising:
    a voltage controlled oscillator (VCO) for generating a carrier signal and for receiving a tuning voltage to control modulation of a radio frequency (RF) signal on the carrier signal;
    a transmitter in communication with the VCO for transmitting the RF signal;
    a synthesizer for generating the tuning voltage input into the VCO for controlling modulation of the RF signal on the carrier signal; and
    a controller including an analog to digital converter (ADC) for receiving the tuning voltage fed back from the synthesizer on a VCO gain tracking feedback loop, a gain control lookup table for storing calibration data for one or more respective mobile station sub-bands, and a digital to analog converter (DAC) for outputting a gain controlled modulation signal, that is based on the calibration data retrieved from the lookup table and based on a curve estimating methodology to mitigate noise associated with the calibration data.

22. The mobile station transmitter configuration of claim 21, wherein the synthesizer comprises a multi-accumulator fract-N synthesizer.

23. The mobile station transmitter configuration of claim 21, wherein the synthesizer comprises:
    a loop filter with a multiplying DAC for multiplying the gain controlled modulation signal and the modulation data signal from the controller to produce a full-scale output voltage that represents a signal to be modulated; and a phase detector for generating an error signal based on the RF signal;

the loop filter also including a lowpass filter for filtering the error signal generated by the phase detector and a summer for summing the error signal and the signal to be modulated to produce the tuning voltage.

24. The mobile station transmitter configuration of claim 23, wherein the synthesizer further comprises:

a divider for dividing the RF signal produced by the VCO for producing a divided RF signal that is input into the phase detector;

a reference oscillator for generating a reference oscillator signal that is also input into the phase detector;

wherein the phase detector is able to generate the error signal based on a phase difference between the divided RF signal and the reference oscillator signal.

25. The mobile station transmitter configuration of claim 21, wherein the controller is programmed to perform a one-time update of the calibration data for the one or more respective mobile station sub-bands.

26. The mobile station transmitter configuration of claim 21, wherein the controller is programmed to perform continuous updating of the calibration data for one of the one or more respective mobile station sub-bands in use whenever multiple tuning voltages, each of which is input thereto from the VCO gain tracking feedback loop, at multiple different locations in the one of the one or more respective mobile station sub-bands in use are measured.

27. The mobile station transmitter configuration of claim 21, wherein the controller is programmed to update the calibration data for the one or more respective mobile station sub-bands by using the curve estimating methodology for a number of tuning voltages, each of which is input thereto from the VCO gain tracking feedback loop, that is greater than an order of polynomial curve fitting model by two or more.

28. The mobile station transmitter configuration of claim 21, wherein the controller is programmed to update the calibration data stored in the lookup table for the one or more respective mobile station sub-bands by using the curve estimation methodology for a number of tuning voltages, each of which is input thereto from the VCO gain tracking feedback loop, the curve estimation methodology using a least squares estimate between a sum of squares of a difference between data produced by a curve estimation model and the calibration data to reduce an effect of noise at an output of the ADC.

29. The mobile station transmitter configuration of claim 21, wherein the gain control lookup table is further for storing calibration data for contiguous mobile station sub-bands.

30. The mobile station transmitter configuration of claim 29, wherein the synthesizer comprises a dual port synthesizer, the calibration data comprises high port gain setting calibration data and the gain control lookup table is for storing calibrated high port gain setting calibration data for the one or more respective mobile station sub-bands.

* * * * *

UNITED STATES PATENT AND TRADEMARK OFFICE
CERTIFICATE OF CORRECTION

PATENT NO. : 6,834,183 B2  Page 1 of 1
APPLICATION NO. : 10/287382
DATED : December 21, 2004
INVENTOR(S) : Black et al.

It is certified that error appears in the above-identified patent and that said Letters Patent is hereby corrected as shown below:

Column 11 line 47 please insert --for-- after the word "loop,"
Column 14 line 36 please insert --a-- after the words "for setting"
Column 14 line 58 please insert --further-- after the word "and"
Column 16 line 7 please insert --a-- after the word "of"

Signed and Sealed this

Twenty-fifth Day of July, 2006

JON W. DUDAS
*Director of the United States Patent and Trademark Office*